(12) United States Patent
Heidari et al.

(10) Patent No.: US 6,423,207 B1
(45) Date of Patent: Jul. 23, 2002

(54) METHOD AND APPARATUS FOR ETCHING

(75) Inventors: Babak Heidari, Lund; Lennart Olsson, Malmö, both of (SE)

(73) Assignee: Obducat AB, Malmo (SE)

( * ) Notice: Subject to any disclaimer, the term of this patent is extended or adjusted under 35 U.S.C. 154(b) by 0 days.

(21) Appl. No.: 09/653,945

(22) Filed: Sep. 1, 2000

Related U.S. Application Data

(63) Continuation of application No. PCT/SE99/00324, filed on Mar. 5, 1999.

(30) Foreign Application Priority Data

Mar. 5, 1998 (SE) .............................................. 9800695
Mar. 5, 1998 (SE) .............................................. 9800706

(51) Int. Cl.$^7$ ................................................. C25F 3/00
(52) U.S. Cl. .............. 205/655; 204/290.01; 204/224 M
(58) Field of Search ........................... 204/290.01, 194, 204/224 M; 205/655

(56) References Cited

U.S. PATENT DOCUMENTS

| | | | |
|---|---|---|---|
| 4,734,174 A | 3/1988 | Venis, Jr. ................. | 204/129.5 |
| 5,071,510 A | 12/1991 | Findler et al. .............. | 156/647 |

FOREIGN PATENT DOCUMENTS

| | | |
|---|---|---|
| EP | 0 106 977 | 5/1984 |
| EP | 0 392 738 | 10/1990 |
| EP | 0 563 616 | 10/1993 |
| GB | 1 600 667 | 10/1981 |
| WO | WO 98/10121 | 3/1998 |

Primary Examiner—Donald R. Valentine
Assistant Examiner—Thomas H. Parsons
(74) Attorney, Agent, or Firm—Finnegan, Henderson, Farabow, Garrett & Dunner, L.L.P.

(57) ABSTRACT

A method of making, by etching, depressions in selected portions of an etching surface of an electrically conductive etching material, the depressions forming an etching pattern, comprises the step of contacting the etching material with an etchant. A passivating layer is formed on the etching material which layer decreases or stops the etching capability of the etchant on the surface and which is dissolved in a chemical reaction when exposed to electromagnetic radiation. An electrode with electrically conductive electrode portions in selected portions of an electrode surface is provided, the electrode portions forming an electrode pattern corresponding to the etching pattern. The electrode is arranged in contact with the etchant and with the electrode portions facing the etching surface of the etching material, an electric voltage is applied between the electrode and the etching material, and the etching material is exposed to electromagnetic radiation essentially perpendicular to the etching surface.

22 Claims, 1 Drawing Sheet

METHOD AND APPARATUS FOR ETCHING

This application is a Continuation of International Application Number PCT/SE99/00324, filed Mar. 5, 1999, the contents of which are incorporated herein by reference.

BACKGROUND OF THE INVENTION

1. Field of the Invention

The present invention relates to a method, an electrode and a device according to the preamble to appended claims 1, 14 and 17.

2. Description of the Related Art

In wet etching methods, a fluid is usually employed, which comprises an etchant capable of reacting in an etching manner with an etching material. In chemical etching, the etchant reacts spontaneously with the etching material, and in electrolytic etching, the etchant reacts by electrochemical reactions on the surface of the etching material when an etchant, with voltage applied, carries a current.

When the purpose of etching is to provide a structure in the etching material by etching away selected parts thereof, the etching material surface which is not to be etched away is usually coated with an etching preventing layer, a so-called mask or resist, which is insensitive or less sensitive to the etchant than the etching material. Such an etching preventing layer is produced in a multistage operation with an initial coating step and a subsequent step for partially removing the layer.

A common etching preventing layer is a photoresist. When using a photoresist, the surface of the etching material is coated in a first step with the photoresist which is sensitive to light. In a next step, the surface areas of the photoresist where etching is to be carried out are exposed to light, and in a subsequent step, these areas are developed and dissolved, thus uncovering the areas of the etching material that are to be etched. This method is currently used, for instance, when manufacturing printed circuit boards for etching away material to form gaps between conductors. The manufacture of an etching preventing layer in prior-art manner thus is complicated and time-consuming.

In wet etching methods, mainly in chemical etching, so-called underetching takes place owing to the isotropic etching properties, i.e. etching away material under the surface coated with an etching preventing layer. In consequence, it is not possible to make gaps having a greater depth than width by pure chemical etching. Nor is it possible in electrolytic etching to etch, in small dimensions, gaps the depth of which exceeds the width. The possibilities of making narrow gaps, for instance, to arrange conductors close to each other, are thus limited when applying wet etching methods. It is also not possible today to achieve even structures by wet etching methods, for instance, gaps with straight walls whose width or depth is below 1 $\mu$m.

SUMMARY OF THE INVENTION

An object of the present invention is to provide improvements in connection with wet etching, especially when etching in very small dimensions, below 1 mm.

A special object is to provide an improved method of etching selected parts of a surface.

One more object is to permit quicker manufacture of etched patterns in a surface.

According to the invention, these and other objects that will appear from the following specification are now achieved by a method, an electrode and a device which are of the types stated by way of introduction and which, in addition, have the features stated in the characterising clause of claims 1, 14 and 17, respectively.

Thus, the invention is based on a new type of electrode for etching selected portions of an etching surface. The electrode has electrically conductive electrode portions in selected portions of an electrode surface. These electrode portions constitute an electrode pattern. When etching according to the invention using such an electrode which is directed towards the etching surface, depressions are made, which form an etching pattern corresponding to the electrode pattern. The etching pattern seen from the electrode will be inverted in relation to the electrode pattern seen from the etching surface.

According to the invention, an etching method for etching selected parts of a surface has thus been provided, without the surface needing to be covered with an etching preventing layer. Such an electrode can be used several times to etch in this manner a plurality of products successively. This enables great improvements in serial etching, both in respect of production times and production costs.

According to a preferred embodiment of the invention, the electrode portions let electromagnetic radiation through. By the electrode portions being permeable to electromagnetic radiation, it is possible to irradiate the etching material through the electrode during etching. The etching material is coated with a passivating layer, which reduces or prevents the capability of the etchant of etching the etching material. The passivating layer is such as to be dissolved in a chemical reaction when exposed to radiation.

According to an alternative embodiment, the passivating layer is exposed to radiation from below through the etching material. The wavelength of the radiation is adapted to the etching material so that the radiation at least partly penetrates the etching material.

It is preferred for the average intensity of the radiation to be so low that the temperature of the passivating layer is kept essentially constant.

According to a preferred embodiment of the present invention, a substance forming a passivating layer on the etching material is added to the etchant. The substance is selected so that the passivating layer is dissolved when exposed to electromagnetic radiation. When the radiation hits the passivating layer, it will be ionised and dissolved.

By providing, according to a preferred embodiment, the substance dissolved in the etchant, the passivating layer will continuously form on the surfaces of the etching material that are not exposed to radiation. As a result, a high anisotropy of the etching is achieved.

According to a preferred embodiment of the invention, the electromagnetic radiation is in the wavelength range 0.01–50 micrometer and preferably in the wavelength range 0.1–10 micrometer. There are a number of light sources that may be used.

In a preferred embodiment, the electrode has electrically insulating portions between the electrode portions. This results in more accurate control of the etching process since distinctly defined electric fields are formed. This is particularly advantageous when etching in small dimensions, below 100 $\mu$m, and yields particularly good conditions for achieving a directed etching effect (anisotropic etching).

Between the electrode portions, the electrode preferably has portions which do not let radiation through. These portions are preferably also electrically insulating portions. Radiation falls only on the portions of the etching surface that are exposed to an electric field. This results in improved anisotropic etching.

The passivating substance can be selected from, for instance, the group consisting of iodine, halide salts, thiosulphates, thiocyanates, ammonia and amines.

In an advantageous embodiment, the insulating portions of the electrode comprise an insulating layer which is applied to the etching surface of the electrode between the electrode portions, which are defined by the insulating layer. This makes it possible to design the electrode in an extremely simple fashion, for instance by an insulating layer being applied directly to a conductive electrode surface. For instance, the layer can be produced in the same manner as a photoresist layer.

According to a special aspect of the invention, use is made of a chemically etching fluid, in which the etchant, which constitutes the active substance, is present in a diluted solution. In this case, extremely good results can be produced, such as exact etchings in small dimensions. This aspect of the invention is based on the surprising discovery that an etching fluid, which has been diluted to have a negligible etching effect, can be used for anisotropic etching under the action of an electric field.

In this connection, etching of an electrically conductive etching material is carried out by means of an etchant, which is present in a solution which is diluted to such an extent that it cannot be practically used for chemical etching. The etchant concentration is so low that there occur only occasionally such reactions between the etchant and the etching material as result in the removal of atoms from the etching material. By an electric field being provided in the etchant solution between the electrode and a surface portion of the etching material, a local concentration of etchant to the surface portion of the etching material forms. This results in a pronounced increase of the etching rate of the etchant while at the same time the etching direction of the etchant is affected.

The invention concerns etching of an electrically conductive material, the etching material. Tests have been made with different metals, such as Cu, Ni, Ti, Al and Cr, but the inventive method is expected to function for other conductive materials, such as alloys, and on semiconductors. The electric conductivity of the etching material should be such that an electric field can be generated in the diluted solution between the etching material and an electrode.

The crystal structure of the etching material is not critical, and the etching material can thus be monocrystalline as well as polycrystalline.

The etchant should be capable of reacting, when dissolved, in an etching way with an etching surface, intended for etching, of the etching material. Besides, it is expected that the etchant should be of such a character as to be affected kinetically by an electric field to enable a local concentration of the etchant.

An important feature according to the special aspect is that the etchant is present in a solution at a low concentration. In view of experiments that have been carried out, the desired anisotropic etching effect seems difficult to achieve with etchant concentrations above 200 mM. However, a lower concentration limit for good function could not be determined. Besides, it is expected that the etchant must have sufficient movability in the solution to permit a local concentration of the etchant.

The electric field is assumed to have two functions, on the one hand, to concentrate the etchant locally and, on the other hand, to accelerate etching, of which the first-mentioned function is currently assumed to be the most important one.

It is assumed that the electric field should be directed towards the surface of the etching material that is to be etched. To make it possible to locally raise the concentration of the etchant, the extent of the electric field at the surface that is to be etched should be relatively limited, which in a favourable way is achieved with the inventive electrode.

The invention is especially, but not exclusively, directed to the manufacture of small structures, smaller than 1 mm, and is, together with a chemically etching etchant in a low concentration, particularly advantageous when manufacturing structures, such as depressions, in the order of 100 $\mu$m and smaller, especially smaller than 50 $\mu$m in respect of etching width as well as etching depth.

By the solution having an extremely low concentration of etchant and a relevant etching process being carried out while being affected by an electric field, the etching process achieves essentially improved controllability and anisotropy compared with prior-art wet methods.

An important property is that, according to the special aspect, it is possible to etch grooves and gaps having a larger depth than width. The ratio of depth to width of an etched gap has in experiments been measured to be 3.5:1 when etching in a thin copper film.

The method according to the special aspect further does not have a critical sensitivity to concentration variations within an efficient concentration range. Experiments have shown that around a concentration value which gives good etching results for a certain combination of etchant-etching fluid, it is possible to change the concentration value by a factor two without significantly deteriorating the etching result.

The etchant, in a diluted solution, is preferably in connection with etching in such a state that its capacity of etching spontaneously, i.e. in the absence of electric field, is restricted to an etching rate of 5 nm/s. For good anisotropy it is advantageous to restrict the spontaneous etching capacity of the etchant to at most 4 nm/s and more preferably to 3 nm/s and below.

The preferred concentration of the etchant is at most 200 mM, preferably at most 100 mM, more preferably at most 20 mM and most advantageously at most 10 mM. It may be generally said that the controllability of the etching process, especially when etching small structures, increases with a reduced etchant concentration. In some contexts, it has been found advantageous to have etchant concentrations below 2 mM, and particularly advantageous to have etchant concentrations of 1 mM and below.

The etchant can preferably be defined as an ionic substance capable of reacting in an etching manner with the etching material. The concentrations stated in connection with the invention concern the concentration of the etchant which is active according to the invention.

It is preferred for the voltage between the electrode and the etching material to be at least 0.5 V, preferably at least 1 V and more preferably at least 1.5 V, and at most 10 V, preferably at most 5 V and more preferably at most 3 V. Good results have been achieved in the range 2 V–2.8 V, and extremely good results have been achieved in the range 2.4–2.6 V. It is difficult to determine a lower limit for the voltage required for etching, and the above-mentioned values are values where a practically usable etching rate is achieved. However, it is important for the voltage not to be equal to or opposed to the electrochemical potential between the etching material and the electrode, which causes all etching action to cease.

The strength of the electric field is advantageously such that the etchant, in the diluted solution, is given an increased etching rate, which preferably is doubled, and more preferably is at least ten times higher than in the absence of the electric field.

In a preferred embodiment, etching occurs during a plurality of first periods, between which the electric field changes, in which case the electric field, between said first periods, is given an inversed direction during second periods. Consequently, residual products are released in an etched depression during the second periods, which again enables a directed etching effect during the next first period.

For the provision of high anisotropy and an exact etching result, it is particularly advantageous if the electrode portions are arranged very close to the etching material. The distance is preferably smaller than 2000 $\mu$m, and more preferably smaller than 1000 $\mu$m. To permit good transport of etching fluid, i.e. etchant in solution, it is preferred that the distance to the electrode, including any insulating layer, is greater than 1 $\mu$m, preferably greater than 5 $\mu$m.

As mentioned above, the invention has particular advantages when using a spontaneously etching etchant. However, there is nothing to prevent the inventive idea from being used also in electrolytic etching.

BRIEF DESCRIPTION OF THE DRAWINGS

For the purpose of exemplification, the invention will be described below with reference to the accompanying drawings, which show preferred embodiments of the invention and in which.

DETAILED DESCRIPTION OF THE INVENTION

Figure 1:
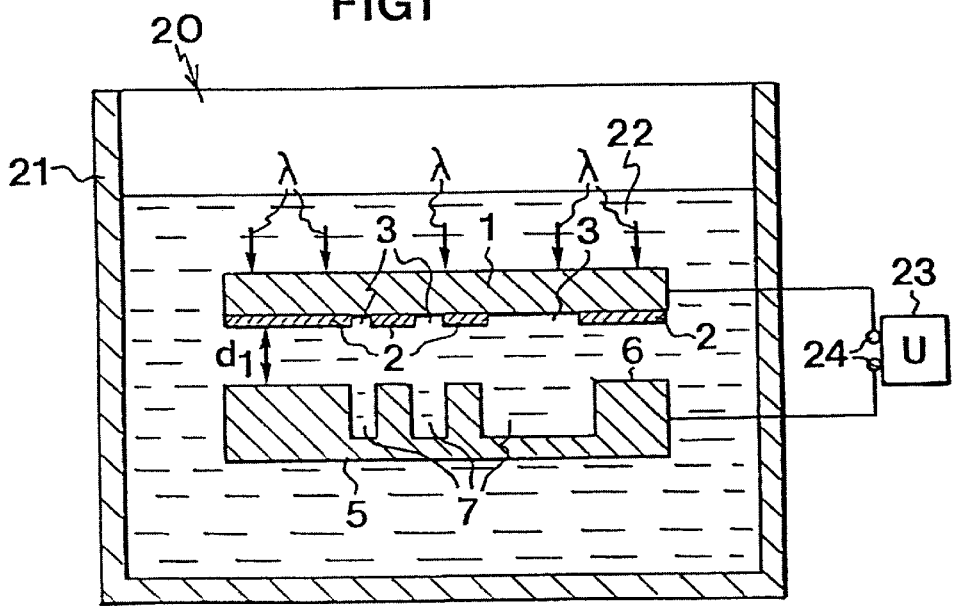
FIG. 1 is a schematic cross-sectional view of a first embodiment of a device for etching and an etching material which is arranged therein and in which etching has been carried out.

FIG. 1 shows a device 20 for etching, comprising an etching vessel 21, which contains a volume of etching fluid 22 and a voltage source 23, which has connecting means 24 for connecting an electrode and an etching material 5. The electrode 1 is made of some suitable metal or alloy and is coated on one side with an electrically insulating layer 2, which is formed by a photolitographic process according to prior art.

Electrode portions 3 are defined between portions of the insulating layer 2. The electrode portions 3 form an electrode pattern, which corresponds to the etching pattern of depressions that is desired in etching. A mirror image of the electrode pattern is provided in etching to form an etching pattern, with an inverted design in relation to the electrode pattern seen from the etching material, of depressions 7 on the surface 6 of the etching material 5.

When etching, the electrode 1 is placed at a distance $d_1$ from an electrically conductive etching material 5 with the electrode portions 3 facing the etching material 5. When etching, the entire assembly of the electrode 1 and the etching material 5 is immersed in an etching fluid 22 and kept in a fixed relationship by means of a holding device (not shown). The etching fluid 22 comprises an etchant which reacts in an etching manner with the etching material 5 when there is a difference in electric potential between the etching material 5 and the electrode 1. The electrode is translucent to radiation $\lambda$ from a source of radiation (not shown). This can be accomplished, for instance, by the electrode being made very thin. The insulating layer 2 forms, in addition to an electric insulator, a radiation barrier, which means that the radiation $\lambda$ merely penetrates the electrode in the electrode surfaces 3. The radiation can be, for instance, parallel beams of UV light.

The closer the electrode 1 is placed to the etching material 5, the better anisotropy is obtained in etching. It is preferred for the distance $d_1$ to be smaller than 1000 $\mu$m. If the distance between electrode and etching material is smaller than 5 $\mu$m, special measures must, however, be taken to achieve good circulation of the etchant in the surrounding etching fluid.

In etching, electric voltage is applied by means of the voltage source 23 between the electrode 1 and the etching material 5, said voltage operating the etching process.

This embodiment is particularly suited for etching with a fluid containing a substance which forms an etching-limiting or etching-preventing passivating layer, either spontaneously or in some other manner when contacting the etching material 5 or in etching. In some cases, such a passivating layer can be excited and removed by being exposed to radiation.

Thus, with the electrode 1 shown in FIG. 1, it is possible, in combination with a suitable fluid, to selectively remove a passivating layer in a bottom area of a depression and let the layer remain on a side wall. When etching occurs, simultaneously or subsequently, merely the uncovered bottom area will be etched, which means that an excellent directed etching effect is achieved despite the absence of an etching preventing layer on the etching material 5.

In the preferred embodiment, the etchant consists of a spontaneous, chemically etching etchant in a low concentration capable of etching the etching material 5, but the inventive idea can also be used for electrolytic etching.

The etchant is present in the etching fluid in such a diluted solution that the etching fluid is not usable for spontaneous chemical etching. The etching fluid can be produced, for instance, by dilution, 20 times, 100 times or more, of a commercially used etching fluid, which in normal use, i.e. in concentrated form, is usable for chemical etching of the etching material. The etchant thus reacts in a chemically etching manner with the etching material.

The etchant concentration in the diluted solution allows only sporadic etching activities which result in the removal of atoms from the substance to be etched.

Figure 2:
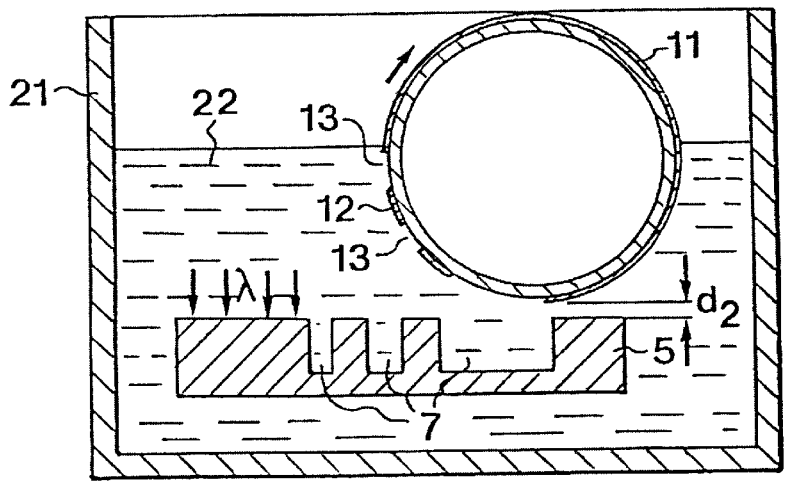
FIG. 2 is a schematic cross-sectional view of a second embodiment of a device for etching and an etching material which is arranged therein and in which etching has been carried out.

FIG. 2 shows a second etching device with a second embodiment of an electrode according to the invention. In this case, the electrode 11 is formed as a roll. On the surface of the electrode roll 11, an insulating layer 12 and electrode portions 13 are arranged in a manner similar to that in the first embodiment. The electrode 11 is, when etching, arranged at a distance $d_2$ from an electrically conductive etching material 5. The distance $d_2$ is preferred to be smaller than 1000 $\mu$m. The great difference between the two embodiments is that the electrode pattern is in this case formed on a roll surface. When etching, a voltage is applied between the electrode roll 11 and the etching material 15 by means of a voltage assembly (not shown) which controls the motion of the roll over the etching material 5. Since merely a small surface of the electrode 11 is positioned close to the etching material, there is in this embodiment no problem with unsatisfactory etchant circulation.

The etching material is exposed to radiation λ from a radiation source (not shown), which exposes the etching material to radiation in front of the roll. The radiation hits the etching material perpendicular to the surface. The speed of the roll is such that the passivating layer did not have time to form again until the roll is located above the area which was previously exposed to radiation. Alternatively, a source of light is arranged within the roll.

Figure 3:
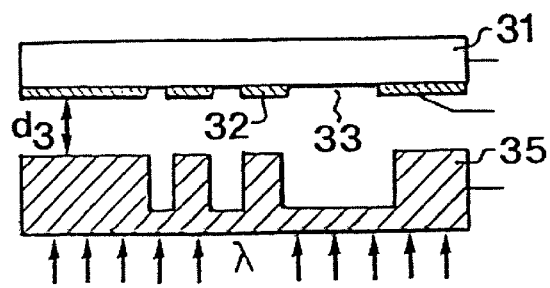
FIG. 3 is a schematic cross-sectional view of a third embodiment of a device for etching.

FIG. 3 shows a third embodiment of an electrode 31. This embodiment resembles the one shown in FIG. 1, in that insulating layer 32 and electrode portions 33 are formed on electrode 31, and is adapted to be arranged in a similar manner in an etching solution, and therefore only the differences will be described here.

The electrode 31 is, when etching, arranged at a distance $d_3$ from an electrically conductive etching material 35. The distance $d_3$ is preferably smaller than 1000 μm. The etching material is from below exposed to radiation λ from a radiation source (not shown). The radiation can be, for instance, parallel beams of UV light. The intensity of the radiation is lower on a side wall than on a bottom surface. It is possible to adjust the intensity of the radiation so that the passivating layer is removed only on surfaces which are perpendicular to the passivating layer, thus obtaining an increased anisotropy of the etching. The wavelength of the radiation is adjusted to the etching material so that radiation penetrates the etching material.

This third embodiment is particularly suited for etching with a fluid containing a substance, which forms an etching-limiting or etching-preventing passivating layer, either spontaneously or in some other manner when contacting the etching material 35 or when etching. In certain cases, such a passivating layer can be excited and removed by being exposed to radiation.

The invention is in no way limited to the embodiments illustrated and described above, and several modifications are feasible within the scope of protection as defined in the appended claims.

For instance, it is not necessary to provide the electrode by a planar or curved electrode surface being provided with an insulating layer. The electrode can be accomplished in several ways, for instance as a number of points or pointed ridges, which define the electrode pattern and are adapted to face the etching material when etching.

What is claimed is:

1. A method of making, by wet etching, depressions in selected portions of an etching surface of an electrically conductive etching material, the depressions forming an etching pattern, the method comprising the step of:
   contacting the etching material with an etchant, characterised by the steps of:
      forming on the etching material a passivating layer, which reduces or prevents the etching capability of the etchant on the surface and which is dissolved in a chemical reaction when exposed to electromagnetic radiation,
      providing an electrode with electrically conductive electrode portions in selected portions of an electrode surface, said electrode portions forming an electrode pattern corresponding to the etching pattern,
      arranging the electrode in contact with the etchant and with the electrode portions facing the etching surface of the etching material, and
      applying an electric voltage between the electrode and the etching material, and
      exposing the etching material to electromagnetic radiation in at least one wavelength range through the electrode portions essentially perpendicular to the etching surface to remove the passivating agent from the surfaces to be etched.

2. A method as claimed in claim 1, wherein the wavelength of the electromagnetic radiation is in the range 0.1–10 micrometer.

3. A method as claimed in claim 1, wherein the etching material is coated with a passivating layer by adding to the etching fluid a substance which forms a passivating layer on the etching material.

4. A method as claimed in claim 1, wherein the etchant is present in a concentration of at most 200 mM.

5. A method as claimed in claim 1, wherein the etchant in concentrated solution is capable of etching the etching material in the absence of an electric field.

6. A method as claimed in claim 1, wherein the etchant in concentrated solution is capable of etching the etching material isotropically in the absence of an electric field, the etching material being contacted with the etchant in such a diluted solution that the etchant is unusable for isotropic etching.

7. A method as claimed in claim 1, wherein anisotropic etching of the etching material is carried out when a voltage is applied between the electrode and the etching material.

8. A method as claimed in claim 1, wherein the electrode is provided with electrically insulating portions between the electrode portions of the electrode surface.

9. A method as claimed in claim 8, wherein the insulating portions of the electrode are provided by an insulating layer being applied to the etching surface of the electrode between the electrode portions, which are defined by the insulating layer.

10. A method as claimed in claim 1, wherein the electrode between the electrode portions of the electrode surface is provided with portions which are impermeable to radiation.

11. A method as claimed in claim 1, wherein the electrode portions are arranged at a distance from the etching material, which distance is smaller than 2000 μm.

12. A method as claimed in claim 1, wherein etching takes place during a plurality of first periods, between which the electric field changes, said change preferably comprising the step of giving the field a reversed direction during second periods.

13. A method as claimed in claim 1, wherein the etchant is present in a concentration of at most 100 mM.

14. A method as claimed in claim 1, wherein the etchant is present in a concentration of at most 50 mM.

15. A method as claimed in claim 1, wherein the etchant is present in a concentration below 10 mM.

16. A method as claimed in claim 1, wherein the electrode portions are arranged at a distance from the etching material, which distance is smaller than 1000 μm.

17. A method as claimed in claim 1, wherein the electrode portions are arranged at a distance from the etching material, which distance is smaller than 500 μm.

18. An electrode for etching depressions in selected portions of an etching surface of an electrically conductive etching material, said electrode having electrically conductive electrode portions in selected portions of an electrode surface, which electrode portions form an electrode pattern, to form, during etching, depressions in the etching surface according to an etching pattern which corresponds to the electrode pattern, characterised in that the electrode portions are capable of letting through radiation (λ) from a source of radiation.

19. An electrode as claimed in claim 18, wherein the electrode has electrically insulating portions between the electrode portions, and the insulating portions form a barrier against said radiation.

20. An electrode as claimed in claim 19, wherein the insulating portions of the electrode comprise an insulating layer which is applied to the etching surface of the electrode between the electrode portions, which are defined by the insulating layer.

21. A device for etching comprising:

an etching vessel which is adapted to contain a quantity of etching fluid, an etching material, and a voltage source, said voltage source having connecting means for an electrode having electrically conductive electrode portions in selected portions of an electrode surface, which electrode portions form an electrode pattern to form, during etching, depressions in the etching surface according to an etching pattern which corresponds to the electrode pattern, characterised in that the electrode portions are capable of letting through radiation ($\lambda$) from a source of radiation.

22. A method of making, by wet etching, depressions in selected portions of an etching surface of an electrically conductive etching material, the depressions forming an etching pattern, the method comprising the step of:

contacting the etching material with an etchant, characterised by the steps of:

forming on the etching material a passivating layer, which reduces or prevents the etching capability of the etchant on the surface and which is dissolved in a chemical reaction when exposed to electromagnetic radiation, providing an electrode with electrically conductive electrode portions in selected portions of an electrode surface, said electrode portions forming an electrode pattern corresponding to the etching pattern, arranging the electrode in contact with the etchant and with the electrode portions facing the etching surface of the etching material, and applying an electric voltage between the electrode and the etching material, and exposing the etching material to electromagnetic radiation in at least one wavelength range through the electrode portions essentially perpendicular to the etching surface to remove the passivating agent from the surfaces to be etched, wherein the etching material is coated with a passivating layer by adding to the etching fluid a substance which forms a passivating layer on the etching material.

* * * * *